United States Patent [19]

Murakami

[11] Patent Number: 4,551,743

[45] Date of Patent: Nov. 5, 1985

[54] SEMICONDUCTOR INTEGRATED CIRCUIT WITH ISOLATION REGION MADE OF DIELECTRIC MATERIAL

[75] Inventor: Kenji Murakami, Yokohama, Japan

[73] Assignee: Tokyo Shibaura Denki Kabushiki Kaisha, Kawasaki, Japan

[21] Appl. No.: 637,707

[22] Filed: Aug. 6, 1984

Related U.S. Application Data

[63] Continuation of Ser. No. 296,476, Aug. 26, 1981, abandoned.

[30] Foreign Application Priority Data

Aug. 29, 1980 [JP] Japan ................... 55-119294

[51] Int. Cl.[4] ............... H01L 21/76; H01L 21/302; H01L 27/04; H01L 29/78
[52] U.S. Cl. ................... 357/50; 357/23.11; 357/55
[58] Field of Search ................... 357/47–50, 357/55, 23.11

[56] References Cited

U.S. PATENT DOCUMENTS

| 4,019,248 | 4/1977 | Black | 357/55 X |
| 4,209,349 | 6/1980 | Ho et al. | 357/50 X |
| 4,264,382 | 4/1981 | Anantha et al. | 357/44 X |
| 4,318,751 | 3/1982 | Horng | 357/50 X |

FOREIGN PATENT DOCUMENTS

| 52-21782 | 2/1977 | Japan | 357/73 |
| 53-18384 | 6/1978 | Japan | 357/50 |

OTHER PUBLICATIONS

"Glass Forming Technique", H. S. Lehman, IBM Tech. Disclosure Bulletin, vol. 8, No. 4, Sep. 1965, pp. 477–478.

Primary Examiner—William D. Larkins
Assistant Examiner—John LaMont
Attorney, Agent, or Firm—Cushman, Darby & Cushman

[57] ABSTRACT

A semiconductor integrated circuit includes pouch-shaped (in sectional view) isolation regions made of dielectric material consisting of boron and phosphor doped silicate glass. A circuit component is formed in an active region surrounded by adjacent isolation regions. Each pouch-shaped (in sectional view) isolation region is made using an anisotropic etchant and an isotropic etchant successively. There is a method for manufacturing the above device with high integration density and high operating speed.

11 Claims, 11 Drawing Figures

SEMICONDUCTOR INTEGRATED CIRCUIT WITH ISOLATION REGION MADE OF DIELECTRIC MATERIAL

This is a continuation of application Ser. No. 296,476, filed 8/26/81, now abandoned.

BACKGROUND OF THE INVENTION

I. Field of the Invention

This invention relates to a semiconductor integrated circuit using dielectrical material to electrically isolate circuit components, and a method for manufacturing the same.

II. Description of the Prior Art

It is well-known to use the selective oxidation technique (S.O.T.) for isolating circuit components. In S.O.T., silicon nitride film is employed as a mask layer to prevent oxidation of a silicon substrate. Circuit components as transistors, diodes and resistors are formed in active regions of the silicon substrate which had been covered by the silicon nitride film. The circuit components are surrounded by a silicon oxide layer (field oxide layer).

However, in an integrated circuit manufactured by S.O.T., the field oxide layer extends to a portion of the substrate where the active region is to be formed. For example, if a field oxide layer of 1 $\mu$m thickness is formed using a silicon nitride layer and silicon oxide layer as masking layers, the field oxide layer extends 0.7 $\mu$m into the portion where the active region is to be formed. Accordingly, in case that the designed width of the active region is $A_1$ and the actual width is $A_2$, the difference ($A_1 - A_2$) is about 1.4 $\mu$m. Therefore at least 1.4 $\mu$m of the width of the supposedly active region is unusable. This reduces the integration density.

SUMMARY OF THE INVENTION

This invention overcomes the problems arising from the processing sequence and the construction of prior art wherein S.O.T. is employed.

One object of this invention is to provide a semiconductor integrated circuit having high integration density.

Another object of this invention is to provide a semiconductor integrated circuit wherein circuit components are isolated by dielectric pouch-like isolation regions extending from the surface to inside of a semiconductor substrate.

Yet another object of this invention is to provide a semiconductor integrated circuit wherein circuit components are surrounded by dielectric pouch-like isolation regions formed using an anisotropic etchant and an isotropic etchant successively.

A further object of this invention is to provide a semiconductor integrated circuit wherein the operating speed thereof is high.

A still further object of this invention is to provide a method capable of manufacturing a semiconductor integrated circuit having a dielectric pouch-like isolation region.

One aspect of this invention involves the formation of an isolation region in a semiconductor substrate. The isolation region being made by filling dielectric material into a groove formed using an anisotropic etching method and an isotropic etching method successively. An active region including a circuit component may be formed completely surrounded by the isolation region.

In another aspect of this invention, a method for manufacturing a semiconductor integrated circuit begins with the step of forming a masking layer on one side surface of a semiconductor substrate having first conductivity type. Portions of the masking layer are then removed and the semiconductor substrate is etched with an anisotropic etchant down to a predetermined depth through the exposed portions of the substrate so as to form an aperture. The bottom portion of the aperture is then etched with an isotropic etchant so as to expand it. The aperture is filled with dielectric material to form isolation regions. An active region forming a circuit component may be disposed on the substrate completely surrounded by an isolation region.

BRIEF DESCRIPTION OF THE DRAWINGS

This invention will now be explained with reference to the accompanying drawings, in which.

DESCRIPTION OF THE PREFERRED EMBODIMENTS

There will now be discussed a semiconductor integrated circuit according to one embodiment of this invention with reference to FIG. 1.

Figure 1:
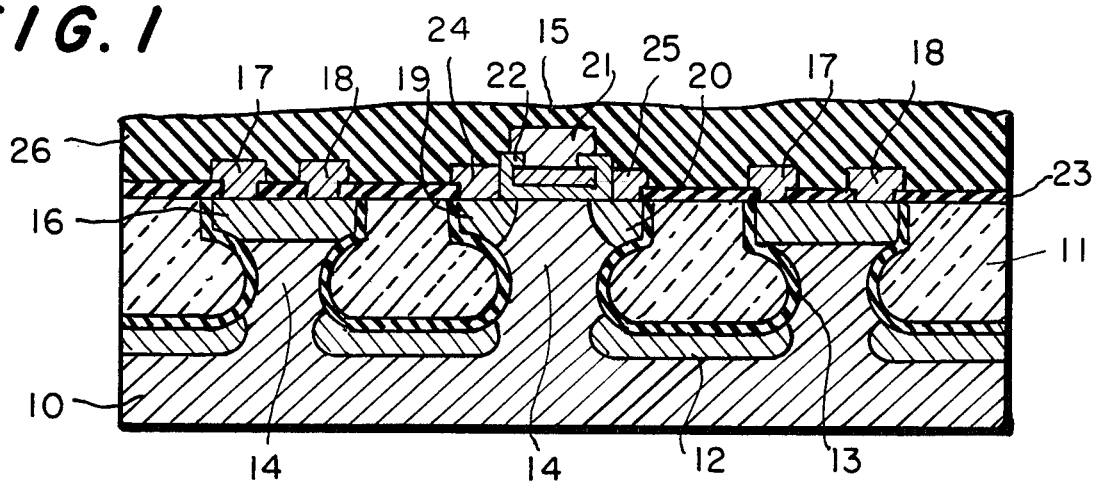
FIG. 1 is a section view showing a semiconductor integrated circuit according to one embodiment of this invention.

In FIG. 1, such circuit components as an Metal Oxide Semiconductor (MOS) transistor, a diode and a resistor are formed in n conductivity type substrate 10. A plurality of dielectric pouch-shaped insulation regions 11, which are narrowed at the surface of the substrate and expanded at the bottom portion thereof, are provided in substrate 10. Insulation regions 11 are formed as follows. Predetermined portions of substrate 10 are etched away by an anisotropic etching method and an isotropic etching method successively and the etched portions are filled with dielectric material consisting of boron, phosphor and silicate glass (B.P.S.G.). Obviously, other dielectric materials could be used, such as phosphorous doped silicate glass or other glasses with a low melting point. This method permits the insulation regions to be located with high accuracy. Isolation regions 11 need not be pouch-shaped. Obviously, isolation regions of any other shape may be used according to the method of this invention.

High impurity region 12 of n conductivity type is formed at the bottom portion of the insulation region 11 to prevent an inversion in the conductivity type of the substrate 10 due to silicon oxide layer 13. Some portions surrounded by isolation regions 11 constitute active regions 14 in which MOS transistor 15 and resistor 16 are formed. The resistor 16 is made by diffusing a p type impurity 16 into the n type substrate 10 at the active region 14.

Electrodes 17 and 18 are formed at opposite ends of diffused region 16. Of course, a diode is formed by the pn junction between the diffused region 16 and the substrate 10.

An MOS transistor 15 is formed at another active region 14, in which source and drain regions 19, 20 of p conductivity type are formed adjacent to respective isolation regions 11 and gate electrode 21 is formed on gate oxide layer 22 in a well known manner. Thermal oxide layer 23 is laminated onto the surface of substrate 10 except for electrodes 17, 18, source and drain electrodes 24, 25 and gate electrode 21 by C.V.D (Chemical Vapor Deposition). Protection layer 26 of silicon oxide covers the whole surface of the substrate 10.

According to this invention, pn junctions between diffused region 16, source and drain regions 19, 20 and substrate 10 stop at the isolation region 11, which results in a decrease of the pn junction area (and therefore, also, the capacitance due to the pn junction) to enable high operating speeds.

According to this invention, it is possible to form active regions 14 isolated by dielectric material with higher accuracy that the prior art, to thereby reduce the area required to form the active region 14 in the substrate 10. This is very effective to obtain higher integration density.

Explanation is now made with reference to FIGS. 2A to 2I, of a method of manufacturing a semiconductor integrated circuit of the above construction.

Figure 2A:
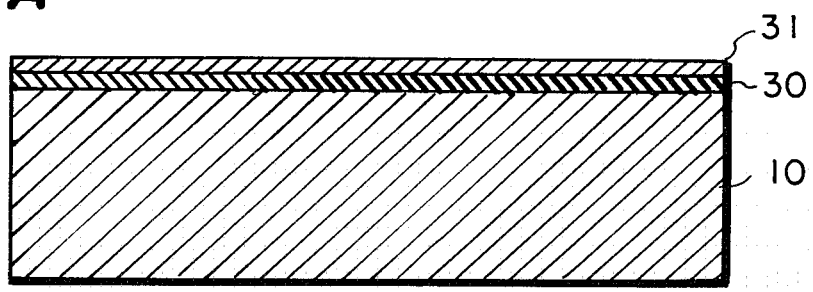
FIGS. 2A to 2I are process views for explaining a method for manufacturing a semiconductor integrated circuit as show in FIG. 1.
Figure 2B:
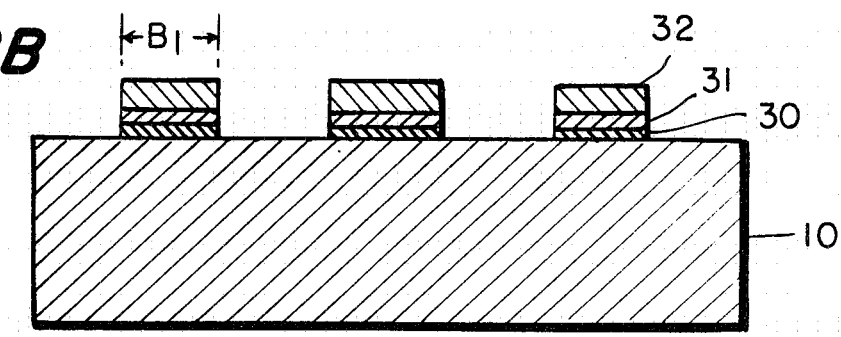
Figure 2C:
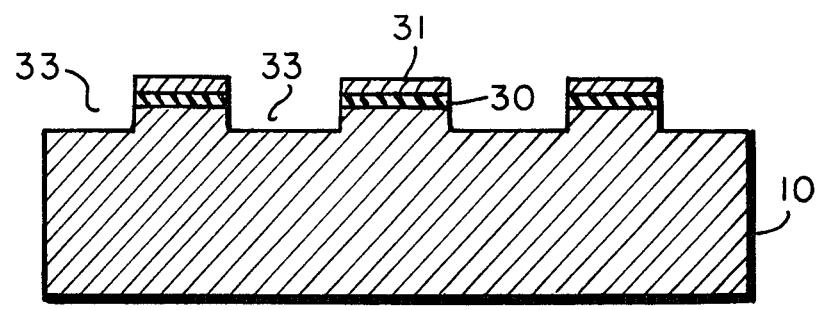
Figure 2D:
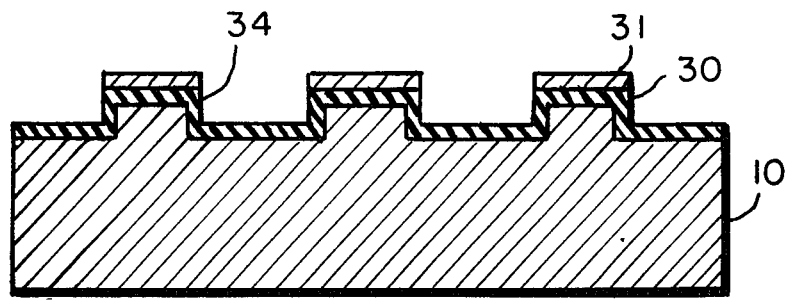
Figure 2E:
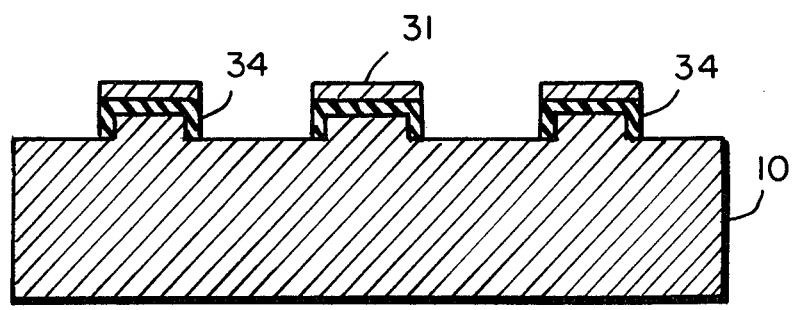
Figure 2F:
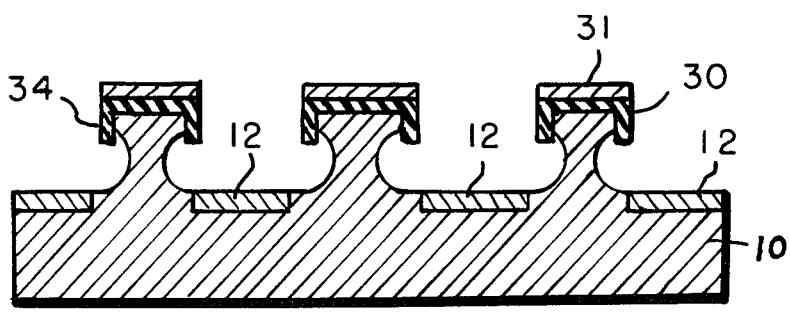

In FIG. 2A, n conductivity type silicon substrate 10 is employed with a thermal oxide layer 30 having 300 Å thickness and a silicon nitride film 31 having 500 Å thickness. Layer 30 and film 31 are formed by C.V.D. on the n type substrate 10 successively as masking layers. Then, as shown in FIG. 2B, photoresist masking layer 32 is applied to portions where active regions are to be formed, and selective etching is used to expose the remaining substrate. As shown in FIG. 2C, after removing photoresist layer 32, selective etching is again employed to form apertures 33 of 1 μm depth at the portions not covered by the masking layers 30, 31 using anisotropic etching (etching in one direction does not cause etching in a transverse direction) such as Reactive Ion Etching (RIE) or reaction ion beam milling. Next, thermal oxide layer 34 having a thickness of 500 Å to 1000 Å is grown over the exposed surface of the substrate 10 by thermal oxidation as shown in FIG. 2D. Subsequently as shown in FIG. 2E the thermal oxide layer 34 at the bottom portion is etched away using an anisotropic etching method. Then as shown in FIG. 2F, an isotropic etching is made by C.D.E. (Chemical Dry Etching) using silicon nitride film 31 as a masking layer. In this step, any etching method may be used which shows an isotropic property (etching which is uniform in all directions) and has a slower speed with thermal oxide layers 30, 34 and silicon nitride film 31 than with semiconductor substrate 10. By this isotropic etching process, a dielectric pouch-shaped isolation region is formed.

Figure 2G:
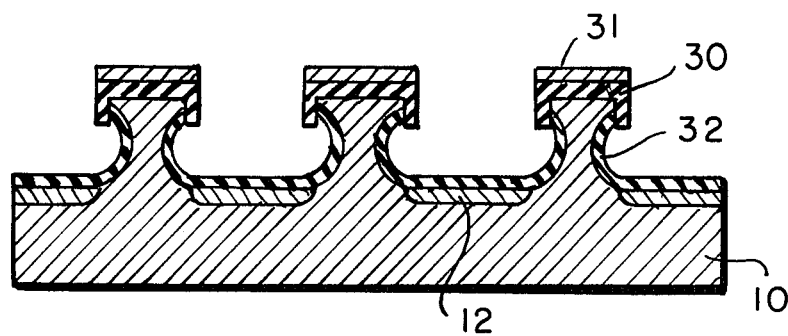
Figure 2H:
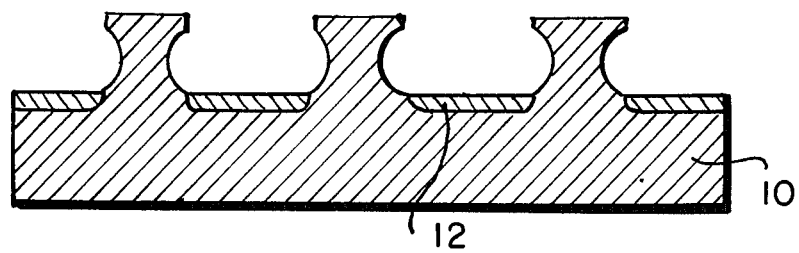
Figure 2I:
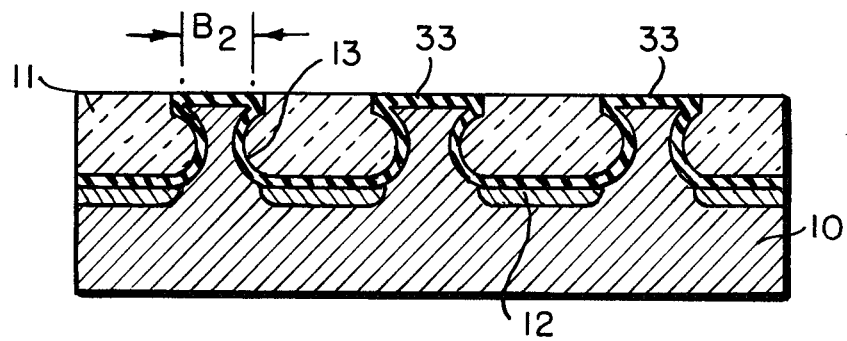

A high impurity concentration layer 12 of n conductivity type is diffused into the bottom portion of the isolation region for preventing inversion of the conductivity of substrate 10 because of the isolation region. Next as shown in FIG. 2G thermal oxide layer 32 having a thickness of 500 Å to 1000 Å is grown over the exposed surface of the pouch like aperture as a protection layer for the following process in which the silicon nitride film 31 is removed. Then, after removing silicon nitride film 31, all the thermal oxide layers 30, 32 are etched away as shown in FIG. 2H. Subsequently, as shown in FIG. 2I, new thermal oxide layer 13 having a thickness of 500 Å to 1000 Å is formed and dielectric material Boron Phosphor, doped Silicate Glass (BPSG) is filled into the pouch-shaped aperture to form isolation region 11. The surface of the isolation region 11 is flattened and then the substrate is held at a high temperature of 1000° C. to stabilize the device. In this manner, active regions surrounded by isolation regions made by dielectric material are formed.

FIG. 1 shows one embodiment, in which MOS transistor 15 and resistor 16 are provided in the active regions using well-known methods after removal of thermal oxide layer 33.

According to the process, the difference between B2 (actual width value of the active region) and B1 (designed width value of the active region) is the thickness of the thermal oxide layer 13 in FIG. 2I. It is below 0.2 μm at its largest extent. The value corresponds to one seventh of the difference using S.O.T. Accordingly, it is possible to form the active region with high accuracy and to make it small, which results in high integration density. Furthermore, a high operating speed can be obtained by decreasing the pn junction areas which are formed between source region, drain region and resistor region and the substrate. In this embodiment a double layer of the thermal oxide layer and silicon nitride film is used as a masking layer as shown in FIG. 2A. However, a single layer of silicon oxide can be used.

Figure 3:
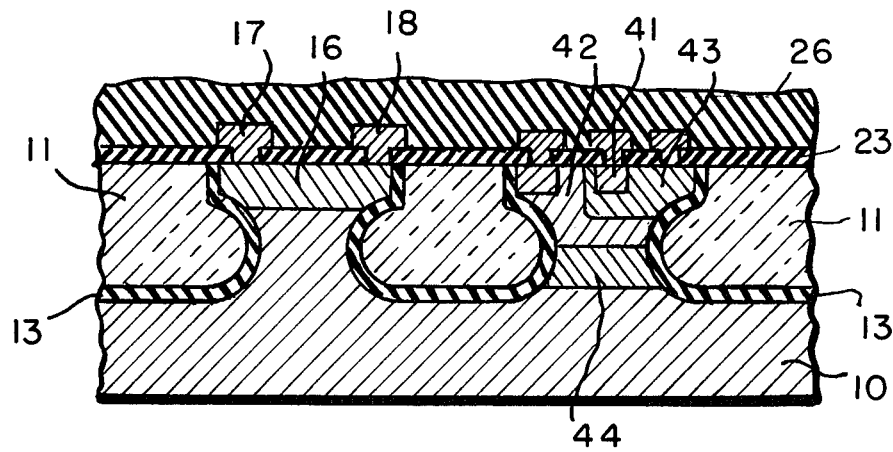
FIG. 3 is a section view showing a semiconductor integrated circuit according to another embodiment of this invention.

FIG. 3 shows another embodiment according to this invention. In this embodiment, a bipolar transistor is formed in the active region. An emitter region 41, collector region 42, base region 43 and buried region 44 are formed by well-known techniques.

In summary, this invention provides many advantages over the prior art. Among these advantages are first, the higher integration density due to the formation of a high accuracy isolation region made of dielectric material, based on a masked design. Second, the operating speed is high because the pn junction area is decreased by the pouch-like isolation region.

Although this invention has been disclosed and illustrated with reference to particular applications, the principles involved are susceptible of numerous other applications which will be apparent to those skilled in the art. The invention is, therefore, to be limited only as indicated by the scope of the claims.

What is claimed is:
1. A semiconductor integrated circuit, comprising:
  (a) a semiconductor substrate having a surface;
  (b) a plurality of isolation regions formed in said substrate and filled with a dielectric material, each of said isolation regions having a first portion near said surface of said substrate with parallel side walls and a second portion below said first portion with side walls extending outwardly beyond said side walls of said first portion, the substrate adjacent the juncture of said first and second portions of at least one of said isolation regions having a constant impurity profile;
  (c) an active region included in said substrate and surrounded by said isolation regions; and
  (d) a circuit component formed at least partially in said active region.
2. The semiconductor integrated circuit recited in claim 1 wherein said dielectric material filling said isolation regions includes boron and phosphorous doped silicate glass.
3. The semiconductor integrated circuit recited in claim 1 wherein a portion of said substrate is of a first conductivity type and said circuit component is a diffused area of said active region having an impurity of a second conductivity type opposite said first conductivity type, a pn junction between said circuit component and the non-diffused portion of said active region existing adjacent one of said isolation regions.

4. The semiconductor integrated circuit recited in claim 3 wherein said isolation regions include further regions at the bottom of said second portions thereof, said further regions having the same conductivity type as said first conductivity type of said substrate, but having a higher impurity concentration than that of said substrate.

5. The semiconductor integrated circuit recited in claim 1 wherein a portion of said substrate is of a first conductivity type and said active region has a diffused portion of a second conductivity type opposite said first conductivity type so as to define said circuit component, an intersection of said circuit component and the non-diffused portion of said active region establishing a pn junction adajacent one of said isolation regions.

6. A semiconductor integrated circuit, comprising:
   (a) a semiconductor substrate having a surface;
   (b) a plurality of isolation regions formed within said substrate and filled with a dielectric material, each of said isolation regions having a first portion near said surface of said substrate with parallel side walls precisely located in a predetermined position and a second portion below said first portion with side walls extending outwardly beyond said side walls of said first portion, the substrate adjacent the juncture of said first and second portions of at least one of said isolation regions having a constant impurity profile;
   (c) an active region included in said substrate and surrounded by said isolation regions; and
   (d) a circuit component formed at least partially in said active region.

7. A semiconductor circuit including a plurality of dielectic-filled isolation regions formed in a substrate each having a first portion with parallel side walls near the substrate surface and a second portion below the first portion extending outwardly beyond said parallel side walls, a defined active region of said substrate surrounded by said isolation regions, and a circuit component formed in said active region, said plurality of isolation regions being formed by a process comprising the steps of:
   (a) forming said first portions by etching with an anisotropic etchant selected portions of the surface of a semiconductor substrate;
   (b) forming said second portions by etching with an isotropic etchant bottoms of said first portions, wherein the substrate adjacent the juncture of said first and second portions of at least one of said isolation regions has a constant impurity profile; and
   (c) filling said first and second portions with said dielectric material to thereby form said isolation regions.

8. A semiconductor intergrated circuit including a plurality of isolation regions filled with a dielectric material, and an active region surrounded by said isolation regions with a circuit component formed therein, said semiconductor integrated circuit being formed by a process comprising the steps of:
   (a) forming a masking layer on one side surface of a semiconductor substrate having a first conductivity type;
   (b) removing selected portions of said masking layer;
   (c) etching with an anisotropic etchant said semiconductor substrate down to a predetermined depth through said removed portions of said masking layer so as to form a plurality of apertures in said substrate;
   (d) etching with an isotropic etchant respective bottom portions of said apertures so as to form lower expanded portions thereof, wherein the substrate adjacent the juncture of said aperture and said lower expanded portion of at least one of said isolation regions has a constant impurity profile;
   (e) filling said apertures with dielectric material to form said isolation regions and define said active region surrounded thereby; and
   (f) forming said circuit component in said active region, wherein
      said anisotropic etching step forms apertures having parallel side walls, and
      said isotropic etching step expands said apertures downwardly and outwardly beyond said parallel side walls.

9. An integrated circuit as in claim 8 wherein said dielectric material comprises boron and phophorous doped silicate glass.

10. An integrated circuit as in claim 8, wherein in said process said circuit component forming step includes diffusing a portion of said active region so as to form a diffused region of a second conductivity type opposite said first conductivity type, a pn junction being formed thereby between said diffused region and the portion complementary thereto of said active region adjacent to at least one of said isolation regions.

11. An integrated circuit as in claim 8 wherein said process includes an additional step just prior to said filling step, said addditional step including forming a further region at the bottom of said lower portions of each of said apertures, said further regions having the same conductivity type as said first conductivity type, but having a higher impurity concentration than that of said substrate.

* * * * *